United States Patent [19]

Ikuzawa

[11] Patent Number: 5,218,318
[45] Date of Patent: Jun. 8, 1993

[54] VARIABLE GAIN AMPLIFIER

[75] Inventor: Kenzo Ikuzawa, Kanagawa, Japan

[73] Assignee: Leader Electronics Corp., Yokohama, Japan

[21] Appl. No.: 835,507

[22] Filed: Feb. 14, 1992

[30] Foreign Application Priority Data

Feb. 14, 1991 [JP] Japan .................................. 3-021066

[51] Int. Cl.⁵ .............................................. H03F 3/30
[52] U.S. Cl. .................................... 330/254; 330/284; 330/311; 330/259
[58] Field of Search ............... 330/145, 254, 284, 311, 330/259, 258

[56] References Cited

FOREIGN PATENT DOCUMENTS

| | | |
|---|---|---|
| 2365 | 1/1977 | Japan .................. 330/254 |
| 2-30605 | 11/1984 | Japan . |
| 2-47625 | 3/1986 | Japan . |
| 62-117404 | 5/1987 | Japan . |
| 2-55171 | 4/1990 | Japan . |

OTHER PUBLICATIONS

National Technical Report, section 3.2.2, "Variable Gain Control Circuit", vol. 27, No. 1, Feb. 1981, pp. 32–39.

*Primary Examiner*—James B. Mullins
*Attorney, Agent, or Firm*—Fish & Richardson

[57] ABSTRACT

A variable gain amplifier is provided which includes a pair of common emitter circuits. A resistance between the collectors of a pair of transistors included within the common emitter circuits is reduced by a variable resistance used for DC level correction which is connected in parallel with a variable resistance used for gain adjustment which is connected between the collectors, thereby reducing the degree of correlation between the width of a variable range of gain and a bandwidth.

16 Claims, 4 Drawing Sheets

VARIABLE GAIN AMPLIFIER

FIELD OF THE INVENTION

The present invention relates to a variable gain amplifier, and particularly to a variable gain amplifier suitable for use in a continuously variable gain device which is used to interpolate the different discrete voltage ranges of, for example, a wide band oscilloscope.

BACKGROUND OF THE INVENTION

In the prior art, continuously variable gain devices used in oscilloscopes employ variable gain amplifiers which include generally unbalanced-type and balanced-type variable gain amplifiers, the latter type using a differential amplifier structure. Variable gain amplifiers of the unbalanced type are illustrated in FIGS. 5 and 6 in which similar elements within the circuits shown in the figures are designated by the similar symbol. The circuit shown in FIG. 6 is disclosed in National Technical Report, Vol. 27, No. 1, February 1981. Both of the circuits are are comprised of a differential cascode amplifier. The circuit of FIG. 5 includes, as a gain adjusting means, a variable resistor VR1 which is provided between the collectors of common-emitter circuit transistors Q1 and Q2 whereby a change in a resistance between the collectors can be used to adjust the gain of the circuit. With this circuit, the gain adjustment cannot be provided by way of electric signals. Also, the upper limit frequency of the bandwidth of the circuit is limited by the existence of a large amount of stray capacitance associated with the variable resistor which is a large component.

On the other hand, the circuit shown in FIG. 6 uses, in place of a variable resistor such as VR1, a pair of diodes D1 and D2 facing each other (the diodes give rise to less stray capacitance) combined with a voltage source for drawing a current I1 from the diodes in order to enable the gain of the circuit to be controlled by an electric signal and also to increase the upper limit frequency of the bandwidth. In this case, the diodes D1 and D2 each operate as a variable resistance the value of which depends on the magnitude of the current I1. Also, the circuit of FIG. 6 is provided as disclosed in the above-mentioned document, with resistors R8 and R9 connected in series for the detection of the DC level of a voltage in the amplifier and a DC correction circuit which functions to correct any shift of the DC level caused by the current I1 drawn from the cascode circuit; correction being carried out by means of a correction current fed into the collectors of common-base circuit transistors Q3 and Q4.

Either of the variable gain amplifiers shown in FIGS. 5 and 6 has a variable range of gain and a bandwidth which are correlated to each other. As a result, if the variable gain range is widened by increasing the resistances of the resistors R4 and R5, which are the parameters for determining the width of the range, the AC signal component generated at each of the collectors of Q1 and Q2 would increase with the result that the bandwidth is narrowed due to the Miller effect. On the contrary, if the resistances of the resistors R4 and R5 are made smaller so as to widen the bandwidth, the variable range of gain would be narrowed.

Accordingly, an object of the present invention is to provide a variable gain amplifier which allows the above-described problem to be alleviated by having a decreased degree of correlation between a variable range of gain and a bandwidth.

Further, another object of the present invention is to provide a variable gain amplifier which has improved frequency characteristics while keeping a variable range of gain having a required width.

SUMMARY OF THE INVENTION

According to the present invention, the above-described object is achieved by a differential cascode amplifier which is provided with a gain adjusting means and a DC level correcting means in such a manner that the resistance between the collectors of a pair of common-emitter circuit transistors included in the amplifier has a decreased value.

More specifically, a variable gain amplifier according to the present invention includes: (1) differential cascode amplifier means including a pair of first and second cascode amplifiers, said first cascode amplifier including a first common emitter amplifier stage having an input terminal and an output terminal and a first common base amplifier stage having an input terminal connected to said output terminal of said first common emitter amplifier stage via a first resistor and an output terminal, said second cascode amplifier including a second common emitter amplifier stage having an input terminal and an output terminal and a second common base amplifier stage having an input terminal connected to said output terminal of said second common emitter amplifier stage via a second resistor and an output terminal; (b) gain adjusting means including a first current controlled variable resistance means, said first variable resistance means being connected between said output terminal of said first common emitter amplifier stage and said output terminal of said second common emitter amplifier stage, said first variable resistance means having a variable resistance value depending on the magnitude of a first current flowing in one of a first direction for the drawing of current from the output terminals of said first and second common emitter amplifier stages and a second direction for the feeding of current to the output terminals of said first and second common emitter amplifier stages; and (c) DC level correcting means including a second current controlled variable resistance means, said second variable resistance means being connected in parallel with said first variable resistance means and between said output terminal of said first common emitter amplifier stage and said output terminal of said second common emitter amplifier stage, said second variable resistance means having a variable resistance value depending on the magnitude of a second current flowing in the other of the first and second directions.

Further, according to the present invention, each of the above-described diode means is comprised of at least one diode.

BRIEF DESCRIPTION OF THE DRAWINGS

The present invention will be hereinafter described in greater detail with reference to the accompanying drawings in which.

DETAILED DESCRIPTION OF THE PREFERRED EMBODIMENTS

Figure 1:
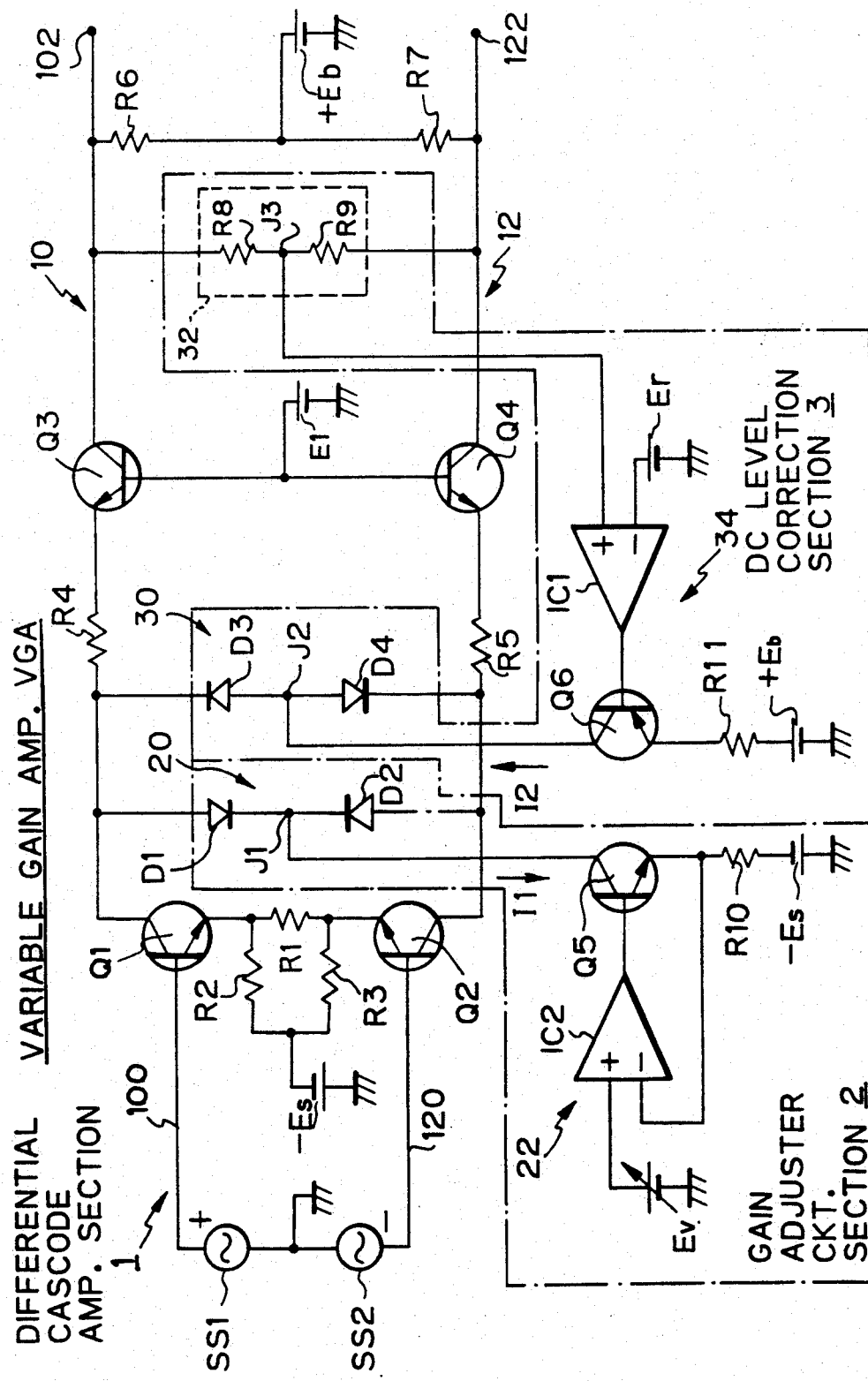
FIG. 1 is a schematic diagram illustrating a circuit of a variable gain amplifier according to the present invention.
Figure 6:
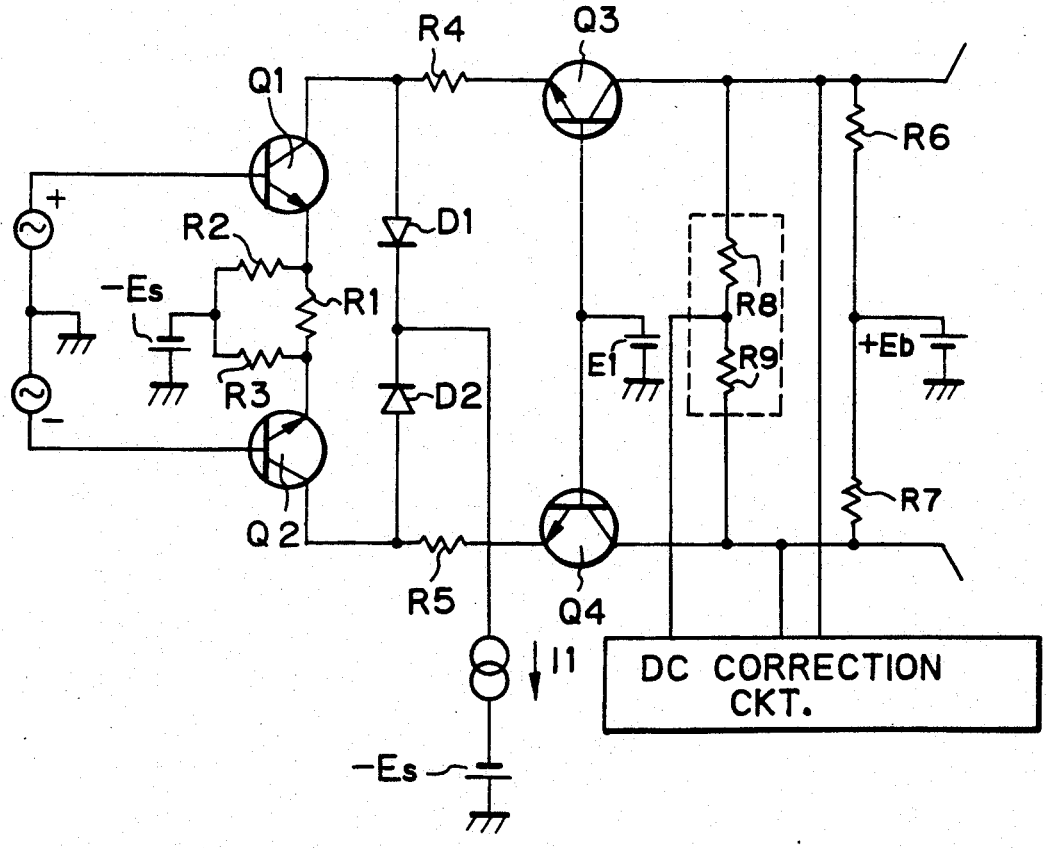
FIG. 6 is a schematic diagram illustrating the circuit of another conventional variable gain amplifier.

Referring to FIG. 1, the circuit of a variable gain amplifier VGA according to the present invention is illustrated, which is suitable for use in a continuously gain variable device for interpolating the different discrete voltage ranges of a wide bandwidth oscilloscope. It should be noted that elements of the circuit similar to those in FIG. 6 are designated by similar symbols. The variable gain amplifier VGA is generally comprised of a differential cascode amplifier section 1, a gain adjuster circuit section 2 and a DC level correction circuit section 3. The amplifier section 1 is comprised of a pair of cascode amplifiers 10 and 12 which are connected in a differential manner. One of the cascode amplifier 10 includes, as in conventional apparatus, a differential input terminal 100 connected to a differential signal source SS1, a common-emitter circuit transistor Q1 having its base (or input terminal) connected to the input terminal 100, a resistor R4 having one end thereof connected to the collector of Q1, a common-base circuit transistor Q3 having its emitter (input terminal) connected to the other end of the resistor, a differential output terminal 102 connected to the collector (output terminal) of Q3 and a resistor R6 connected between the output terminal and a positive voltage source +Eb (ex. +12 volts). The emitter of the common-emitter transistor Q1 is connected to a negative voltage source −Es (ex. −12 volts) via resistors R1, R2 and R3. The base of the common-base transistor Q3 is connected to a positive voltage source E1 (ex. +5 volts). Similarly, the other cascode amplifier 12 includes a differential input terminal 120 connected to a differential signal source SS2, a common-emitter circuit transistor Q2, a resistor R5, a common-base circuit transistor Q4, a differential output terminal 122 and a resistor R7.

Figure 2:
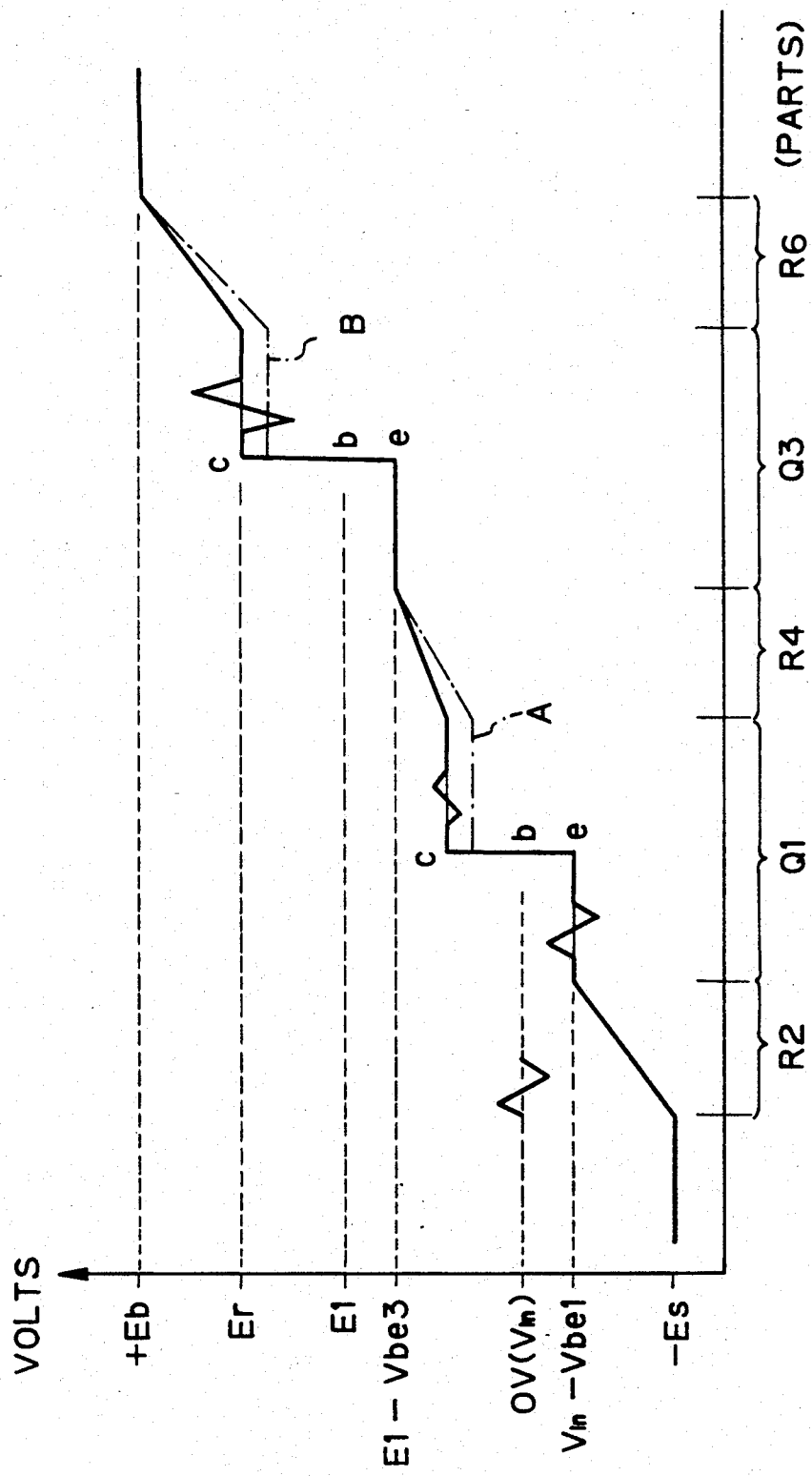
FIG. 2 is a level diagram illustrating the DC levels of voltages present in the various elements within the variable gain amplifier circuit shown in FIG. 1.

FIG. 2 illustrates the DC levels of several voltages existing in the circuit elements lying between the power supplies −Es and +Eb of the cascode amplifier by taking one of the cascode amplifier 10 by way of example. It is noted that the symbols used to identify the power supplies are also used to represent the potentials thereof. Also, Vbe1 and Vbe3 denote the base-emitter voltages of the associated transistors Q1 and Q3. Further, AC signal components (indicated by triangular waves for the purpose of illustration) are also shown, and Vin denotes an input signal voltage applied to the base of Q1 from the signal source SS1. Responding to the signal input, an in-phase AC signal component occurs at the emitter of Q1, while opposite-phase AC signal components appear at the collectors of the Q1 and Q3 (Note: AC components existing within resistors are not shown). It should be understood that no AC voltage signal component appears at the base of Q3 because of the common-base configuration thereof.

The gain adjuster circuit section 2 functions to adjust the degree by which the AC signal components having opposite phases to each other, which appear at the collectors of Q1 and Q2, cancel with each other in order to adjust the gain of the cascode amplifiers 10 and 12, and is generally comprised of a current controlled variable resistance section 20 and a voltage controlled current source 22. More specifically, the variable resistance element 20 includes a pair of diodes D1 and D2 having cathodes connected in common, which is connected between the collectors of Q1 and Q2, as the conventional circuit shown in FIG. 6. Each of the diodes functions as a current controlled variable resistance the value of which is determined depending on the magnitude of current flowing therethrough. In order to draw the current, that is, a current I1 having a controlled magnitude from the collectors of Q1 and Q2 through the diodes D1 and D2, the current source 22 includes, as shown, a current source transistor Q5 having its collector connected to a junction J1 to which the cathodes of the diodes are connected in common. The source 22 also includes a resistor R10 which is connected between the emitter of Q5 and a negative voltage source −Es such that a voltage component having a value proportional to the magnitude of the current I1 is formed. The emitter of Q5 is also connected to the inverting input of a differential amplifier IC2 which has its non-inverting input connected to a variable voltage source Ev for gain setting. The output of the amplifier IC2 is connected to the base of Q5. Thus, when the voltage Ev is increased in order to lower the gain of each of the amplifiers 10 and 12, then the differential amplifier IC2 biases Q5 in such a manner that the magnitude of the current I1 is increased, thereby making the resistance of each of the diodes D1 and D2 smaller.

Here, the gain G of the variable gain amplifier VGA is given by $$G = \{Rcc/(R4+R5+Rcc)\}Go, \quad (1)$$

where Go denotes the gain of the amplifier VGA when I1 is equal to zero, and Rcc denotes the resistance between the collectors of Q1 and Q2 (note here that R4 and R5 are also used as the symbols for representing the resistance values of the associated resistors). If only D1 and D2 were present between the collectors, as in the conventional circuit in FIG. 6, without D3 and D4 being provided, which will be described later, then, Rcc=2Ro would result where Ro is the resistance value of each of the diodes D1 and D2.

Now, the DC level correction circuit section 3 provided according to the present invention will be described. The circuit 3 serves, as in the conventional one in FIG. 6, to feed a current I2 of the same magnitude as that of the current I1 into the amplifiers 10 and 12 in order to compensate for any shift in level of DC voltage components existing in the amplifiers which is caused by the current I1 drawn from the amplifiers 10 and 12 by the above-described gain adjuster circuit 2. The circuit 3 is generally comprised of a current controlled variable resistance element 30, a DC level detector section 32 and a voltage controlled current source 34. It should be noted that the circuit 3 is, unlike that of FIG. 6, arranged to feed the current I2 into the collectors of Q1 and Q2 rather than the collectors of Q3 and Q4. More specifically, the variable resistance element 30 is comprised of a pair of diodes D3 and D4 which is connected between the collectors of Q1 and Q2 in parallel with the variable resistance element 20 of the diodes D1 and D2. For the purpose of current feeding, the cathodes of the diodes D3 and D4 are connected to the associated collectors, respectively, while their anodes are connected to a junction J2. In order to control the magnitude of the current I2 in accordance with the level of a DC voltage component present at the differential output terminal 102 or 122, the detector 32 is provided with resistors R8 and R9 connected in series between the output terminals. Since the resistance values of the R8 and R9 are set to be equal, only a DC voltage component will appear at a junction J3 between the resistors with any AC component being canceled out. Then, the current source 34 includes a differential amplifier IC1 which is connected to receive the output from the detector at the non-inverting input and a reference voltage Er (ex. 8 volts) at the inverting input. The source 34 also includes a current source transistor Q6 having its base connected to receive the differential output of the amplifier IC1 and its collector coupled to the junction J2, and a resistor R11 which is connected between the emitter of the transistor Q6 and a positive voltage source +Eb. The above-mentioned reference voltage Er is set equal to a DC level which is to be maintained at each of the collectors of Q3 and Q4, that is, the DC voltage level of the collectors when I1 is equal to zero.

With reference to FIG. 2, the operation of the correction circuit will be hereinafter described in connection with only the amplifier 10 (the amplifier 12 operates in the same manner as the amplifier 10). In the first place, it is assumed that the level diagram illustrated in FIG. 2 shows the levels of DC voltages within the circuit when no current I1 flows. With this condition, if current I1 having a certain magnitude is drawn by the gain adjuster circuit 2 in order to lower the gain G, then, the current flowing through the resistor R4 will increase (note: Q1 operates as a constant current source), resulting in an increased voltage drop across the resistor R4 as indicated by a dashed line A in FIG. 2. This causes the DC level of the voltage at the collector of Q1 to be lowered. Further, the current flowing through the resistor R6 is also increased, resulting in an increased voltage drop across the resistor R6 and hence a lowered DC voltage level at the collector of Q3, as indicated by a dashed line B in the same figure. The correction circuit 3 which responds to the DC level of the collector of Q3 feeds the current I2 into the collectors of Q1 and Q2 in response to that drop such that the DC levels of the collectors of Q1 and Q3 are recovered from the positions indicated by the dashed lines A and B to the original positions indicated by solid lines.

As can be seen from the above, when the current I1 flows, the current I2 having substantially the same magnitude as that of the current I1 will flow, and thus I1=I2. Therefore, assuming that each of the resistance values of the diodes D3 and D4 is equal to the resistance value Ro of each of the D1 and D2, then the collector-to-collector resistance value Rcc will be equal to Ro. This means that the Rcc is reduced to one half of that for the conventional circuit in FIG. 6.

A relationship between this reduced collector-to-collector resistance Rcc, the variable range of gain and the bandwidth of the amplifier VGA is hereinafter described. Here, if R4=R5, then the expression (1) gives $$G = \{Rcc/(2R4 + Rcc)\}Go. \quad (2)$$

Here, the ratio of variation of gain G/Go is given by $$G/Go = Rcc/(2R4 + Rcc). \quad (3)$$

As compared with the conventional circuit shown in FIG. 6, if R4 is fixed, and when Rcc is maximum ($Rcc_{max}$), the maximum of the ratio $(G/Go)_{max}$ remains unchanged as indicated by $$(G/Go)_{max} \approx 1,$$

but, when Rcc is minimum ($Rcc_{min}$), the minimum of the ratio $(G/Go)_{min}$ is given by $$(G/Go)_{min} \approx Rcc_{min}/2R4, \quad (4)$$

resulting in that the ratio can have a value further reduced by a factor of ½. Thus, the variable range of gain can be made wider according to the present invention.

Conversely, for the same variable range of gain as that of FIG. 6, it will be seen from the expression (4) that the resistance of the resistor R4 shown in FIG. 1 according to the present invention can be decreased to one half of that for the circuit of FIG. 6. With the circuit in FIG. 1, when the resistance value of each of the resistors R4 and R5 is made one half, the collector impedance Zc of each of Q1 and Q2 is also reduced (Zc is approximately equal to R4 or R5). This causes AC signal components appearing at the collectors of Q1 and Q2 to be smaller, resulting in smaller influences caused by the Miller effect. Thus, the upper limit frequency of the bandwidth of the variable gain amplifier can be increased.

Figure 3:
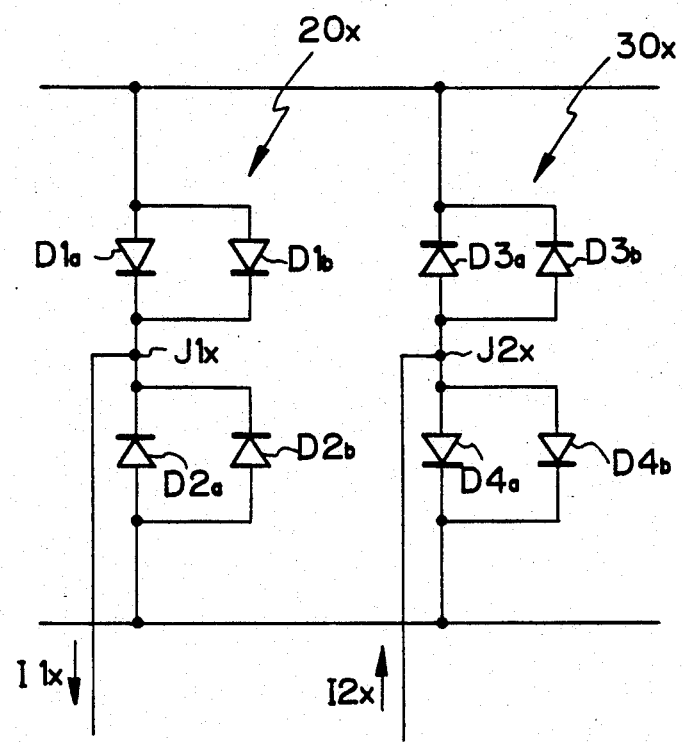
FIG. 3 is a schematic diagram illustrating another embodiment of the variable resistance element included in the circuit shown in FIG. 1.
Figure 4:
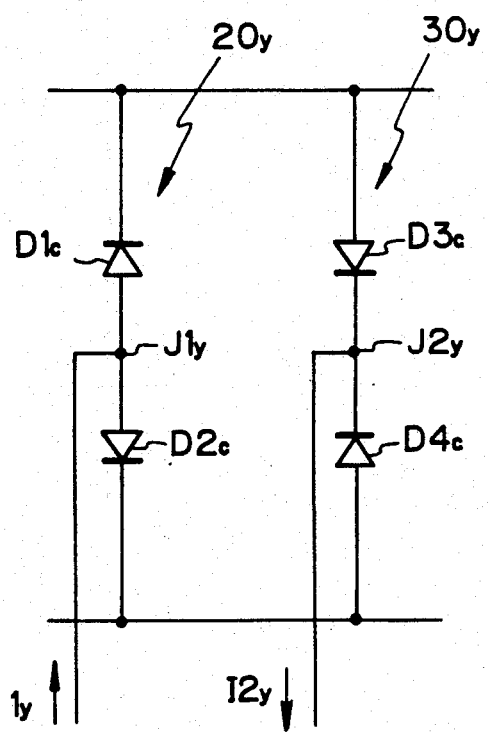
FIG. 4 is a schematic diagram illustrating a further embodiment of the variable resistance element in FIG. 1.
Figure 5:
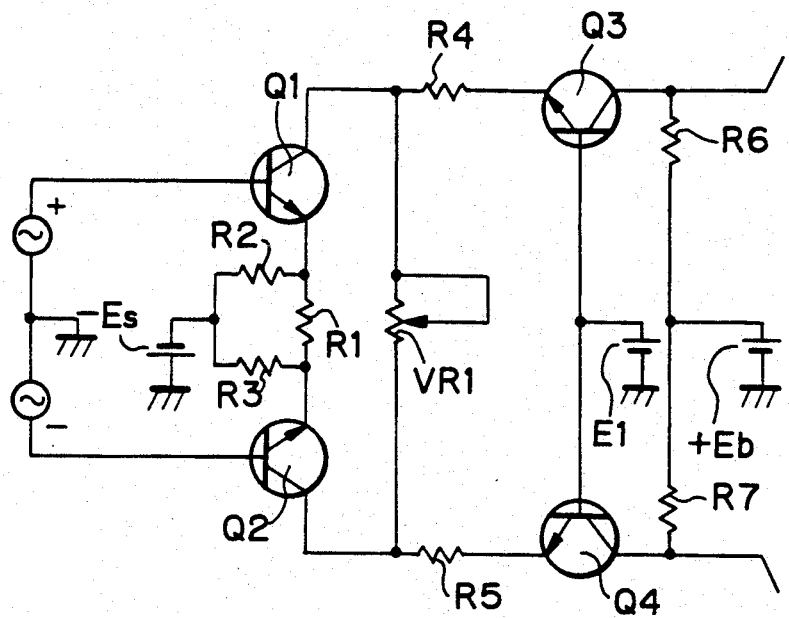
FIG. 5 is a schematic diagram illustrating the circuit of a conventional variable gain amplifier.

In the above-described embodiment of the present invention, the following modifications are possible. First, in order to realize the collector-to-collector resistance having a smaller value, current controlled resistance elements 20x and 30x shown in FIG. 3 may be used in place of the variable resistance elements 20 and 30 shown in FIG. 1, in which sets of two parallelly connected diodes D1a and D1b through D4a and D4b substitute for the diodes D1 through D4 within the resistance elements 20 and 30, respectively. Also, it is possible to increase the number of the parallelly connected diodes, if necessary. Secondly, in place of the resistance elements 20 and 30 in FIG. 1, the resistance elements 20y and 30y shown in FIG. 4 may also be used, in which the variable resistance element 20y is arranged to feed current into the cascode amplifiers rather than drawing it therefrom for the gain adjustment (D1c and D2c), while the variable resistance element 30y for correcting the DC level is arranged to draw current (D3c and D4c). In this case, it is required to modify the current sources 22 and 34 such that the direction of flow of each of the associated currents is reversed. Such a reversal of the directions of currents may also be applied to the arrangement shown in FIG. 3. Thirdly, it should be understood by those skilled in the art that the present invention can be similarly applied to the arrangement in which PNP transistors are used as Q1 through Q4 in FIG. 1.

As described above, according to the present invention, an electrically controlled variable gain amplifier can be arranged to have a reduced degree of correlation between a bandwidth and the width of a variable range of gain with a minimum number of elements added. Thus, for use in wide band oscilloscopes, a variable gain amplifier having a greater bandwidth as required can be realized.

What is claimed is:

1. A variable gain amplifier comprising:
   differential cascode amplifier means including a pair of first and second cascode amplifiers, said first cascode amplifier including a first common emitter amplifier stage having an input terminal and an output terminal and a first common base amplifier stage having an input terminal connected to said output terminal of said first common emitter amplifier stage via a first resistor and an output terminal, said second cascode amplifier including a second common emitter amplifier stage having an input terminal and an output terminal and a second common base amplifier stage having an input terminal connected to said output terminal of said second common emitter amplifier stage via a second resistor and an output terminal;
   gain adjusting means including a first current controlled variable resistance means, said first variable resistance means being connected between said output terminal of said first common emitter amplifier stage and said output terminal of said second common emitter amplifier stage, said first variable resistance means having a variable resistance value depending on the magnitude of a first current flowing in one of a first direction for the drawing of current from the output terminals of said first and second common emitter amplifier stages and a second direction for the feeding of current to the output terminals of said first and second common emitter amplifier stages; and
   DC level correcting means including a DC level detector means for detecting a DC level of a voltage at said output terminal of said first common base amplifier stage, a controlled current source being responsive to said detected DC level for generating a second current having a magnitude required for maintaining said detected DC level to a predetermined level, and a second current controlled variable resistance means, said second variable resistance means being connected in parallel with said first variable resistance means and between said output terminal of said first common emitter amplifier stage and said output terminal of said second common emitter amplifier stage, said second variable resistance means having a variable resistance value depending on the magnitude of said second current flowing in the other of the first and second directions.

2. A variable gain amplifier as set forth in claim 1 further characterized by:
   said first variable resistance means comprising a pair of diode means for drawing said first current from said output terminals, said first pair of diode means having cathodes connected to a first junction and anodes connected to said output terminals of said first and second common emitter amplifier stages, respectively; and
   said second variable resistance means comprising a second pair of diode means for feeding said second current into said output terminals, said second pair of diode means having anodes connected to a second junction and cathodes connected to said output terminals of said first and second common emitter amplifier stages, respectively.

3. A variable gain amplifier as set forth in claim 2 further characterized by:
   said gain adjusting means further comprising a controlled current source connected to said first junction of said first pair of diode means for generating to said first junction said first current having a magnitude depending on a gain setting; and
   said controlled current source of said DC level correcting means being connected to said second junction of said second pair of diode means and responsive to said detected DC level for generating to said second junction said second current.

4. A variable gain amplifier as set forth in claim 3 wherein said controlled current source of said gain adjusting means comprises:
   a gain control voltage source for providing a voltage used for setting a gain corresponding to said gain setting; and
   a voltage controlled current source connected to receive said voltage from said gain control voltage source for generating said first current having a magnitude depending on the magnitude of said voltage.

5. A variable gain amplifier as set forth in claim 1 further characterized by:
   said first variable resistance means comprising a first pair of diode means for feeding said first current into said output terminals, said first pair of diode means having anodes connected to a first junction and cathodes connected to said output terminals of said first and second common emitter amplifier stages, respectively; and
   said second variable resistance means comprising a second pair of diode means for drawing said second current from said output terminals, said second pair of diode means having cathodes connected to a second junction and anodes connected to said output terminals of said first and second common emitter amplifier stages, respectively.

6. A variable gain amplifier as set forth in claim 5 further characterized by:
   said gain adjusting means further comprising a controlled current source connected to said first junction of said first pair of diode means for generating to said first junction said first current having a magnitude depending on a gain setting; and
   said controlled current source of said DC level correcting means being connected to said second junction of said second pair of diode means and responsive to said detected DC level for generating to said second junction said second current.

7. A variable gain amplifier as set forth in claim 6 wherein said controlled current source of said gain adjusting means comprises:
   a gain control voltage source for providing a voltage used for setting a gain corresponding to said gain setting; and
   a voltage controlled current source connected to receive said voltage from said gain control voltage source for generating said first current having a magnitude depending on the magnitude of said voltage.

8. A variable gain amplifier as set forth in any of claims 2 through 7 wherein each said diode means comprises at least one diode.

9. A variable gain amplifier comprising:
   differential cascode amplifier means including a pair of first and second cascode amplifiers, said first cascode amplifier including a first common emitter amplifier stage having an input terminal and an output terminal and a first common base amplifier stage having an input terminal connected to said output terminal of said first common emitter amplifier stage via a first resistor and an output terminal, said second cascode amplifier including a second common emitter amplifier stage having an input terminal and an output terminal and a second common base amplifier stage having an input terminal connected to said output terminal of said second common emitter amplifier stage via a second resistor and an output terminal;

gain adjusting means including a first current controlled variable resistance means, said first variable resistance means being connected between said output terminal of said first common emitter amplifier stage and said output terminal of said second common emitter amplifier stage, said first variable resistance means having a variable resistance value depending on the magnitude of a first current flowing in one of a first direction for the drawing of current from the output terminals of said first and second common emitter amplifier stages and a second direction for the feeding of current to the output terminals of said first and second common emitter amplifier stages; and DC level correcting means including a DC level detector means for detecting a DC level of a voltage at said output terminal of said second common base amplifier stage, a controlled current source being responsive to said detected DC level for generating a second current having a magnitude required for maintaining said detected DC level to a predetermined level, and a second current controlled variable resistance means, said second variable resistance means being connected in parallel with said first variable resistance means and between said output terminal of said first common emitter amplifier stage and said output terminal of said second common emitter amplifier stage, said second variable resistance means having a variable resistance value depending on the magnitude of said second current flowing in the other of the first and second directions.

10. A variable gain amplifier as set forth in claim 9 further characterized by:
said first variable resistance means comprising a pair of diode means for drawing said first current from said output terminals, said first pair of diode means having cathodes connected to a first junction and anodes connected to said output terminals of said first and second common emitter amplifier stages, respectively; and
said second variable resistance means comprising a second pair of diode means for feeding said second current into said output terminals, said second pair of diode means having anodes connected to a second junction and cathodes connected to said output terminals of said first and second common emitter amplifier stages, respectively.

11. A variable gain amplifier as set forth in claim 10 further characterized by:
said gain adjusting means further comprising a controlled current source connected to said first junction of said first pair of diode means for generating to said first junction said first current having a magnitude depending on a gain setting; and
said controlled current source of said DC level correcting means being connected to said second junction of said second pair of diode means and responsive to said detected DC level for generating to said second junction said second current.

12. A variable gain amplifier as set forth in claim 11 wherein said controlled current source of said gain adjusting means comprises:
a gain control voltage source for providing a voltage used for setting a gain corresponding to said gain setting; and
a voltage controlled current source connected to receive said voltage from said gain control voltage source for generating said first current having a magnitude depending on the magnitude of said voltage.

13. A variable gain amplifier as set forth in claim 9 further characterized by:
said first variable resistance means comprising a first pair of diode means for feeding said first current into said output terminals, said first pair of diode means having anodes connected to a first junction and cathodes connected to said output terminals of said first and second common emitter amplifier stages, respectively; and
said second variable resistance means comprising a second pair of diode means for drawing said second current from said output terminals, said second pair of diode means having cathodes connected to a second junction and anodes connected to said output terminals of said first and second common emitter amplifier stages, respectively.

14. A variable gain amplifier as set forth in claim 13 further characterized by:
said gain adjusting means further comprising a controlled current source connected to said first junction of said first pair of diode means for generating to said first junction said first current having a magnitude depending on a gain setting; and
said controlled current source of said DC level correcting means being connected to said second junction of said second pair of diode means and responsive to said detected DC level for generating to said second junction said second current.

15. A variable gain amplifier as set forth in claim 14 wherein said controlled current source of said gain adjusting means comprises:
a gain control voltage source for providing a voltage used for setting a gain corresponding to said gain setting; and
a voltage controlled current source connected to received said voltage from said gain control voltage source for generating said first current having a magnitude depending on the magnitude of said voltage.

16. A variable gain amplifier as set forth in any of claims 10 through 15 wherein each said diode means comprises at least one diode.

* * * * *